United States Patent [19]

Huang

[11] Patent Number: 5,716,860
[45] Date of Patent: Feb. 10, 1998

[54] CMOS INPUT BUFFER WITH NMOS GATE COUPLED TO VSS THROUGH UNDOPED GATE POLY RESISTOR

[75] Inventor: Tiao-Yuan Huang, Cupertino, Calif.

[73] Assignee: VLSI Technology, Inc., San Jose, Calif.

[21] Appl. No.: 756,900

[22] Filed: Dec. 2, 1996

Related U.S. Application Data

[62] Division of Ser. No. 274,928, Jul. 14, 1994, Pat. No. 5,581,105.

[51] Int. Cl.$^6$ .............................................. H01L 21/8238
[52] U.S. Cl. ........................ 437/34; 437/56; 437/47; 148/DIG. 136
[58] Field of Search .............................. 437/34, 56, 57, 437/58, 47, 60, 918; 148/DIG. 136

[56] References Cited

U.S. PATENT DOCUMENTS

| | | | |
|---|---|---|---|
| 5,126,279 | 6/1992 | Roberts | 437/918 |
| 5,182,621 | 1/1993 | Hinooka | 257/546 |
| 5,196,233 | 3/1993 | Chan et al. | 437/918 |
| 5,457,062 | 10/1995 | Keller et al. | 437/47 |
| 5,534,448 | 7/1996 | Baldi | 437/34 |
| 5,585,302 | 12/1996 | Li | 437/60 |

*Primary Examiner*—Michael Trinh
*Attorney, Agent, or Firm*—Clifton L. Anderson

[57] ABSTRACT

An input buffer for a CMOS integrated circuit comprises parallel pairs of complementary PMOS pull-up and NMOS pull-down transistors. For each NMOS transistor, a polysilicon NMOS gate lead structure includes three sections: a heavily doped gate section, an undoped resistor section, and a heavily doped contact section. The heavily doped contact section is contacted by a metal delivering a logic low voltage ($V_{SS}$) so that the NMOS gate is resistively coupled to $V_{SS}$. This resistance cooperates with the gate to drain resistance to define a voltage divider between $V_{SS}$ and $V_{IN}$. This voltage divider leaves the gate at a small positive voltage during an electrostatic discharge event. This ensures that all NMOS transistors of a buffer become current bearing before any of them enters second breakdown. This arrangement maximizes input-buffer protection from electrostatic discharge events. The novel NMOS arrangement is readily compatible with CMOS fabrication techniques.

2 Claims, 3 Drawing Sheets

CMOS INPUT BUFFER WITH NMOS GATE COUPLED TO VSS THROUGH UNDOPED GATE POLY RESISTOR

This application is a division of application Ser. No. 08/274, 928, filed Jul. 14, 1994, and issued as U.S. Pat. No. 5,581, 105 on Dec. 3, 1996.

BACKGROUND OF THE INVENTION

The present invention relates to integrated circuits and, more particularly, to input structures for CMOS integrated circuits. A major objective of the present invention is to provide for cell-based ASIC CMOS integrated circuits with enhanced tolerance of electrostatic discharge (ESD).

Much of modern progress is associated with the increasing circuit density and speeds of integrated circuits. CMOS (Complementary Metal-Oxide-Silicon) technology has provided integrated circuits with relatively low power requirements and, concomitantly, relatively low power dissipation. The low power dissipation minimizes damaging heat buildup, while low power requirements are attractive for portable applications and, more generally, for energy conservation.

In terms of both time and money, while the marginal per integrated circuit costs can be quite low (with reasonable manufacturing yields), the start up costs can be quite substantial. Thus, while integrated circuits can be very economical when produced in large quantities, low volume runs can be prohibitively expensive. Low volume runs are important, not only for certain specialized applications, but as intermediate steps in the development of integrated circuits eventually destined for large volume production.

An important sub-industry has emerged to provide for relatively low-cost, easy-to-design, "custom" integrated circuits. These custom circuits are widely referred to as "application-specific integrated circuits" or "ASICs". One type of ASIC is "cell based". A cell library is a collection of predefined modular functional units. An ASIC designer can assemble a custom integrated circuit by appropriately arranging these modular units.

Since the cell library is preselected and its specifications are known in advance, design time is shortened relative to design that proceeds on the level of individual transistors. Furthermore, since different designs can share the same cell library, processing parameters can be held constant across designs. Thus, cell-based ASICs provide much of the cost savings associated with large volume runs to small volume ASIC runs.

One of the problems that CMOS integrated circuits face is vulnerability to ESD. While circuit design can comfortably limit the internal voltages of an integrated circuit design, there is little control over the voltages that can be applied to the inputs and outputs of the integrated circuit itself. Electric charges can build up in a number of situations; accumulated charges (static electricity) suddenly discharged across the pins of an integrated circuit can destroy the circuit. Those skilled in the art are aware of precautions that must be taken in system design and integrated circuit handling to minimize the occurrence of ESD. Nevertheless, ESD can and does occur. Therefore, it is highly desirable to reduce the vulnerability of the integrated circuits themselves to ESD.

Accordingly, it is general practice to include specific input/output structures, not only to buffer incoming and outgoing signals, but also to protect the circuit against ESD. Typical "multifinger." I/O buffer cells include multiple pairs of transistors, each pair configured with one PMOS "pull-up" transistor and one NMOS "pull-down" transistor. The source of the PMOS transistor is connected to a logic high voltage ($V_{DD}$), while the drain of the PMOS transistor is connected to the output and/or input voltage. The drain of the NMOS transistor is also connected to the input/output voltage and thus to the drain of the PMOS transistor. The source of the NMOS transistor is tied to a logic low voltage ($V_{SS}$).

If the buffer is used for output, the gates of the PMOS and NMOS transistors are tied to internal transistors to implement a conventional pull-up/pull-down configuration. If the buffer is used for input only, the gate of the NMOS transistor is conventionally connected to the logic low voltage, while the gate of the PMOS transistor is connected to the logic high voltage. With their gates tied to fixed voltages, these input-only transistors do not serve the conventional pull-up/pull-down function actively. Herein, the PMOS and NMOS transistors of an input buffer are considered "inactive" pull-up and pull-down transistors, respectively.

When a sufficiently great positive "first-breakdown" voltage ($V_{t1}$) is applied to the drain of an NMOS pull-down transistor, an avalanche source/drain current is induced. The voltage drops to a snap-back voltage ($V_{SB}$) as this current is established. At this point, the transistor functions as a NPN bipolar transistor, with current increasing with voltage. A further voltage increase to a second breakdown voltage ($V_{t2}$), results in a further current surge and a concomitant voltage drop. This second voltage drop is associated with destruction of the transistor. The objective of ESD protection is to prevent transistors from suffering this second breakdown.

Because ESD damage is associated with excessive current, more robust I/O buffers include several PMOS/NMOS pairs in parallel to divide ESD-induced currents. This design is referred to as "multi-finger", each of the transistor pairs constituting a "finger". Due to processing non-uniformities, $V_{t1}$ can vary among the different NMOS transistors of a multi-finger I/O buffer. During an ESD event, the voltage reduction after the first NMOS transistor enters its bipolar mode temporarily prevents other transistors from reaching their slightly higher $V_{t1}$s and thus from entering their bipolar modes. Thus, the first transistor must bear the entire current load.

If the first transistor reaches the second breakdown voltage $V_{t2}$ before the other transistors enter their bipolar modes, the first transistor will be destroyed. The destruction can then cascade to other transistors. If other transistors enter bipolar mode before the first transistor reaches $V_{t2}$, the resulting voltage drops and current divisions serve to protect all the transistors. Accordingly, it is desirable that all $V_{t1}$s be lower than all $V_{t2}$s for an I/O buffer. In other words, the nominal difference between $V_{t2}$ and $V_{t1}$ should be greater than the variations in $V_{t1}$ and $V_{t2}$ due to processing non-uniformities.

In the event of a negative-going ESD event, the drain/substrate junction is forward biased. The resulting current relaxes the charge buildup due to the ESD event. Thus, positive-going ESD events, during which the drain/substrate is reverse biased, are a greater concern than negative-going ESD events.

In the abstract, the PMOS pull-up transistors could act in a fashion complementary to the action of the NMOS pull-down transistors. It would counter charge build up during positive ESD events since its drain/substrate junction is forward biased. During negative ESD events, it should be subject to the two breakdown transitions at $V_{t1}$ and $V_{t2}$. However, in the response to the ESD event, the NMOS transistor dominates. This is due, in part, to the fact that the PMOS transistors are formed within an n-well within a p-type substrate. This renders them less efficient in their response to ESD events. Accordingly, the primary concern is the response of the NMOS transistors to positive ESD events. (In the atypical case where PMOS pull-up transistors act more efficiently than the NMOS pull-down transistors, negative ESD events are the primary concern.)

It has been observed empirically that input-only buffers are more subject to ESD destruction than are output buffers and input/output buffers. Thus, input buffers have become the weak link of ESD resistance. In accordance with this discovery, some input buffers connect each included NMOS gate to the drain of another NMOS transistor that has its gate and source tied to the logic low voltage. This arrangement has improved ESD protection.

The physical explanation for the success of this approach appears to be that the extra transistor lowers the voltage ($V_{t1}$) at which the NMOS pull-down transistor transitions to bipolar operation relative to the voltage ($V_{t2}$) at which the NMOS transistor in bipolar operation reaches second breakdown, and thus destruction. By lowering the voltage at which the transition to bipolar operation occurs relative to the voltage at which the transition to second breakdown occurs, one ensures that the other NMOS transistors will reach bipolar operation and share the ESD current before any of the transistors enter second breakdown.

The added transistors coupling the NMOS pull-down transistor gates to ground places the ESD protection afforded to input buffers on a par with that afforded to output-capable transistors. These additional transistors cost additional silicon real estate, which is particularly expensive in cell-based ASIC applications. What is needed is a more economical cell-based input buffer with enhanced ESD.

SUMMARY OF THE INVENTION

The present invention provides a multi-finger input buffer in which the gates of at least some included transistors are resistively coupled to a suitable fixed voltage through a pattern-doped polysilicon lead. The polysilicon lead includes at least three sections: a heavily doped gate section defining a transistor gate, a heavily doped contact section including a contact location, and an undoped or lightly doped resistor section lying electrically between the gate section and the contact section. More specifically, the resistance of said resistor section is at least ten times the resistances of the gate and contact sections. The resistor section cooperates with the gate oxide between the gate and the transistor drain to define a voltage divider between the fixed voltage and the drain voltage. During an ESD event, the voltage causes a small gate voltage, lowering $V_{t1}$, and enhancing ESD protection.

Since, in general, it is the NMOS transistor of a PMOS/NMOS pair of a multifinger input buffer that requires ESD protection, the preferred realization of the present invention uses a pattern-doped polysilicon lead to define the NMOS gate and resistively couple it to a logic low voltage. The gate of the PMOS transistor coupling can mirror that of the NMOS transistor or, more simply, be electrically connected to a logic high voltage by a uniformly heavily doped polysilicon lead. In an NMOS embodiment of the invention, the pull-up function can be performed by a resistor. In fact, this resistor can be a second pattern-doped polysilicon lead. In alternative embodiments, PMOS transistors alone can be coupled to a logic high voltage via pattern-doped polysilicon leads.

The method of the present invention can be implemented beginning after transistor active regions have been formed in a monocrystalline silicon substrate, a gate oxide has been grown, and the gate polysilicon is deposited. The undoped gate polysilicon is patterned to define polysilicon leads that define gates and their connections to suitable fixed logic level voltages. For all NMOS (and/or PMOS) transistors of an input buffer, all resistor sections of these leads are masked. In general, this resistor mask is made along with the masks used to protect PMOS source and drain regions from the heavy n-type dopant implant. The exposed polysilicon lead regions, including the gate sections and contact sections are then heavily doped. This doping can conveniently be used for the NMOS source and drain doping.

The resistor section mask can then be removed; alternatively, it can be left in place. A submetal oxide is formed and patterned to define contact apertures. These expose contact locations for each of the leads. In general, contact openings also expose drains and sources. A metal interconnect structure then connects the PMOS source to the logic high voltage and the NMOS source to the logic low voltage. The metal interconnect structure also connects the NMOS and PMOS drains to the input voltage. Finally, the metal interconnect structure connects the logic high voltage to the contact section of the NMOS gate polysilicon lead and the logic low voltage to the contact section of the PMOS gate polysilicon lead.

Due to the resistor section of the NMOS gate polysilicon lead, the NMOS gate is resistively coupled to the logic low voltage. In general, the resistance of the resistor section should be 5% to 20% of the gate-to-drain resistance. This will result in a 1–2 volt gate voltage during an ESD event, which is roughly optimal for ESD protection.

A major advantage of the present invention is the enhanced ESD protection it provides by lowering $V_{t1}$ relative to $V_{t2}$, causing all input-buffer fingers to bear current before any are destroyed. This is accomplished without requiting extra transistors. This leaves the maximum number of transistors available for other integrated circuit functions, and keeps the input buffer structure simple. Furthermore, the method of fabricating the inventive input structures is process compatible with existing cell-based ASIC CMOS technology. No additional steps are required, only a modification of existing masks. These and other features and advantages of the present invention are apparent from the description below with reference to the following drawings.

DESCRIPTION OF THE PREFERRED EMBODIMENTS

Figure 1:
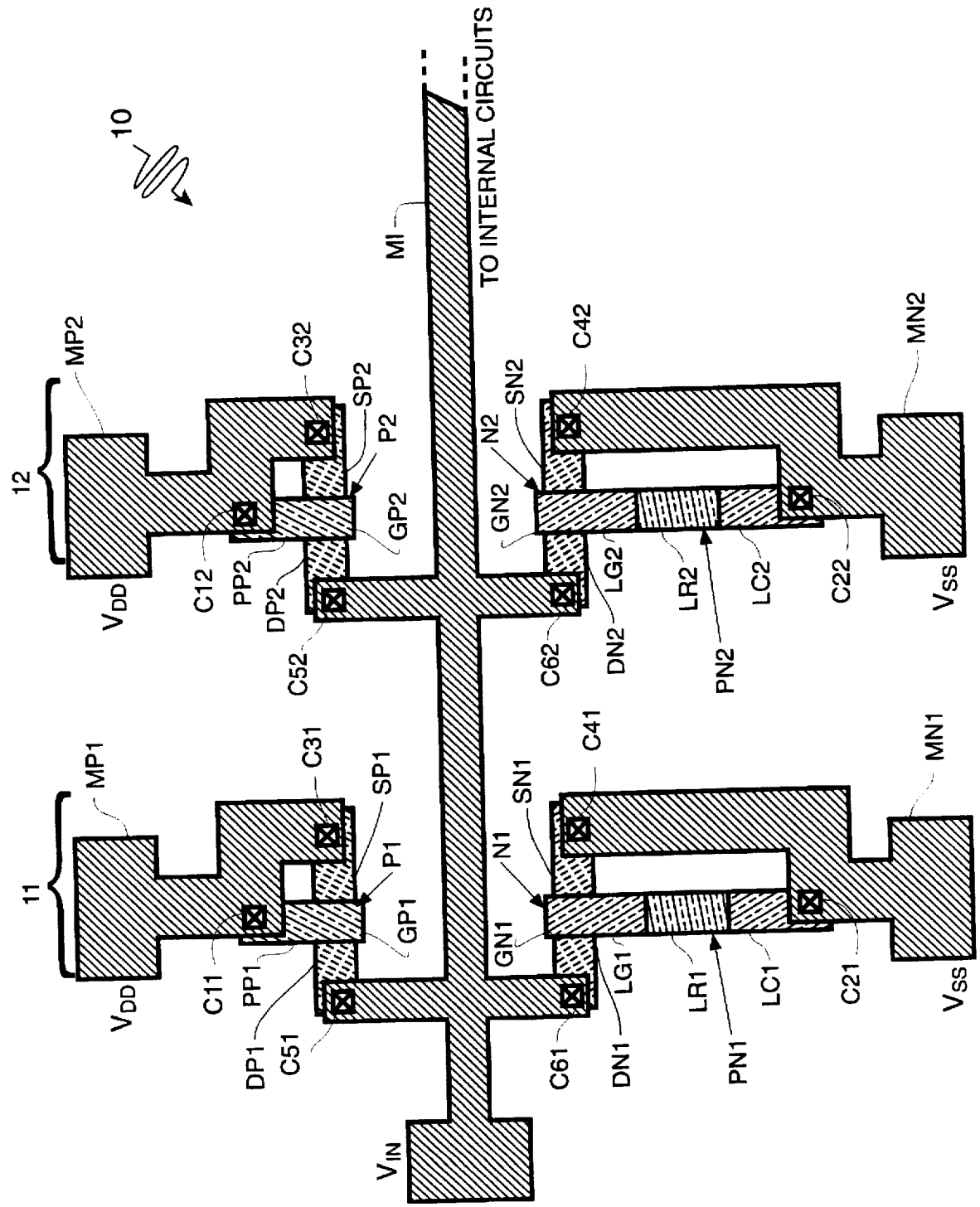
FIG. 1 is a schematic plan view of an input buffer for a CMOS integrated circuit in accordance with the present invention. For silicon and polysilicon regions dopant type and concentration are very roughly indicated by the sign and slope of the hatching. The overlap of elements has been modified to make the connections between elements clearer.

A CMOS input buffer 10 in accordance with the present invention is fabricated with three levels of conductors: a monocrystalline silicon substrate level, a polysilicon level, and a metal level. These three levels of conductors define eight complementary pairs of transistors. Transistor pair 11 includes PMOS pull-up transistors P1 and NMOS pull-down transistor N1. Transistor pair 12 includes PMOS pull-up transistor P2 and NMOS pull-down transistor N2. The other six pairs are not illustrated, but are nominally identical. In alternative embodiments, the number of transistor pairs ranges from 2 to more than 20.

The substrate level includes the sources and drains for transistor pair 11: a heavily doped p-type source SP1 for PMOS transistor P1, a heavily doped p-type drain DP1 for transistor P1, a heavily doped n-type source SN1 for NMOS transistor N1, and a heavily doped n-type drain DN1 for transistor N1. The substrate level similarly bears source SP2 and drain DP2 of transistor P2 as well as source SN2 and drain DN2 of transistor N2.

The polysilicon level defines two polysilicon leads for pair 11: a "PMOS" polysilicon lead PP1 and an "NMOS" polysilicon lead PN1. Heavily doped p-type lead PP1 defines the gate of PMOS transistor P1 and extends to a contact C11. Lead PN1 includes three sections: a gate section LG1, a resistor section LR1, and a contact section LC1. Heavily doped n-type gate section LG1 defines the gate of transistor N1. Heavily doped n-type contact section LC1 physically and electrically connects to a contact C21. Undoped resistor section LR1 extends from section LG1 to section LC1. The polysilicon layer also defines leads PP2 and PN2 for pair 12; lead PN2 includes gate, resistor, and contact sections LG2, LR2, and LC2. Other than the undoped resistor sections LR1 and LR2, the polysilicon leads are heavily doped n-type so that they are conductive.

The metal level provides three conductors that contact transistor pair 11: a pull-up conductor MP1, a pull-down conductor MN1, and an input conductor MI. Conductor MP1 includes contact C11 to polysilicon lead PP1 and contact C31 to PMOS source SP1. Conductor MP1 connects these elements to $V_{DD}$. Conductor MN1 includes contact C21 to polysilicon contact section LC1 and contact C41 to NMOS source SN1, connecting these elements to $V_{SS}$. Conductor MI includes contact C51 to PMOS drain DP1 and contact C61 to NMOS drain DN1, connecting these elements to variable input voltage $V_{IN}$.

Conductor MI also includes contact C52 to PMOS drain DP2 and contact C62 to NMOS drain DN2 to connect these elements to $V_{IN}$. The metal level also includes conductors MP2, defining contacts C12 and C32, and MN2, defining contacts C22 and C42, serving the same function with respect to pair 12 as comparable components serve with pair 11.

The resistance of resistor section LR1 is selected so that gate GN1 assumes about a one-volt potential with respect to $V_{SS}$ when drain DN1 is at an ESD potential of 10–12 volts. This requires that the resistance of resistor section LR1 be one-tenth (with a tolerance of −50%, +100%) that of the gate to drain AC resistance through gate oxide ON1. In the present case, this latter resistance is 1 megaohm (MΩ), so the desired resistance of LR1 is 100 kilo-ohms (kΩ). Section LR1 is lightly doped so that it has a resistance of 50 kΩ per square. Accordingly, LR1 is two squares long. Since buffer 10 is fabricated using 0.5 micron (μm) design rules, LR1 is 1 micron long.

Those skilled in the art recognize that the gate-drain resistance can vary widely among integrated circuits, e.g., from 1–1000 MΩ. Preferably, then, the resistance of a resistor section should be selectable from 0.1 to 100 MΩ. The two major factors in determining the resistance of a strip of polysilicon are its bulk resistivity and the ratio of its length to its cross section.

The bulk resistivity of the initially deposited silicon is process dependent. Some processes result in resistivities greater than 100 MΩ per square. In other processes, the as-deposited polysilicon can be lightly doped; for example, depositing polysilicon in the presence of a diluted phosphine ($PH_3$) can provide resistivities around 50 kΩ per square. The resistance of the as-deposited polysilicon can be lowered by subsequent doping, either before or after patterning. For example, after patterning, the resistor section can be doped concurrently with the lightly doped drain implant. Further control of resistivity can be implemented using doping in a nonuniform manner across the resistor width.

For a given bulk resistivity, the resistance of a polysilicon resistor is determined by the ratio of its length to its cross section. Since the polysilicon thickness is generally fixed, this ratio is treated as a length-to-width ratio and resistivity is expressed in ohms per square; a square represents a 1:1 length-to-width ratio. For a given width, resistance can be selected by choosing the length of the resistor section. In general, there is considerable latitude in allowing the resistor section to meander on the field oxide to achieve a desired resistance. The resistance of the polysilicon can be increased further by etching so that its cross section is reduced. Accordingly, the flexibility to select the bulk resistivity and the ratio of length to cross section provides staple latitude in achieving a desired resistance.

Figure 2:
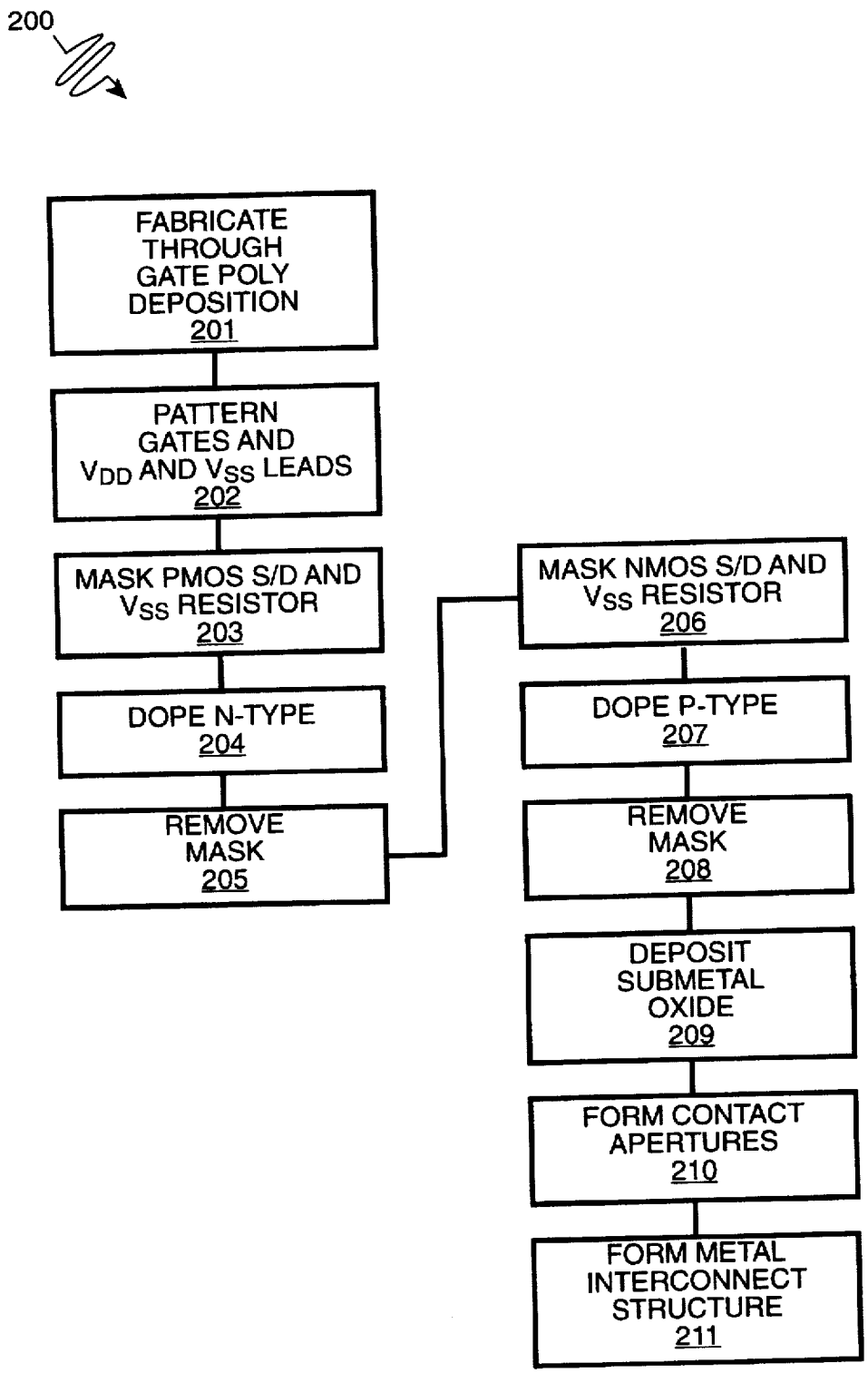
FIG. 2 is a flow chart of a method in accordance with the present invention.

Input buffer 10 can be fabricated in the context of conventional CMOS processing by method 200, flow charted in FIG. 2. The method begins with CMOS fabrication through deposition of the gate polysilicon at step 201. The gate polysilicon is deposited in the presence of xylene so that it is lightly doped with an AC resistance of 50 kΩ per square. In a conventional method, this polysilicon is patterned to define gates and some local interconnects. In the present case, the gate mask is designed so that polysilicon leads are defined. Thus, in step 202, the polysilicon is patterned to form polysilicon leads PP1, PP2, PN1, and PN2.

In a conventional CMOS fabrication technique, PMOS sources and drains are masked to protect them from a subsequent heavily n-type implant. In step 203, resistor sections LR1 and LR2 are masked along with PMOS sources and drains SP1, SP2, DP1, and DP2. Also PMOS polysilicon leads PP1 and PP2 are masked. A heavily n-type source/drain dopant implant is effected at step 204, rendering exposed sections LG1, LG2, LC1 and LC2 conductive. The mask is then removed at step 205.

Steps 206, 207, and 208, are basically analogous to steps 203, 204 and 205. In step 206, the NMOS sources and drains are masked, and NMOS polysilicon leads PN1 and PN2 (including, of course, resistor sections LR1 and LR2) are masked. At stop 207, a heavy p-type dopant is implanted into the PMOS sources and drains as well as polysilicon leads PP1 and PP2. The mask material is removed at step 208.

In the preferred dual poly process, submetal oxide SMO is formed by deposition at step 209. Contact apertures are formed at step 210 through submetal oxide to expose the sources and drains, polysilicon leads PP1 and PP2, and polysilicon sections LC1 and LC2. The metal interconnect structure is formed at step 211, forming contacts with the silicon and polysilicon elements exposed in the previous step. The metal interconnect structure can include multiple metal layers and intermetal dielectrics, as well as a final passivation dielectric.

Figure 3:
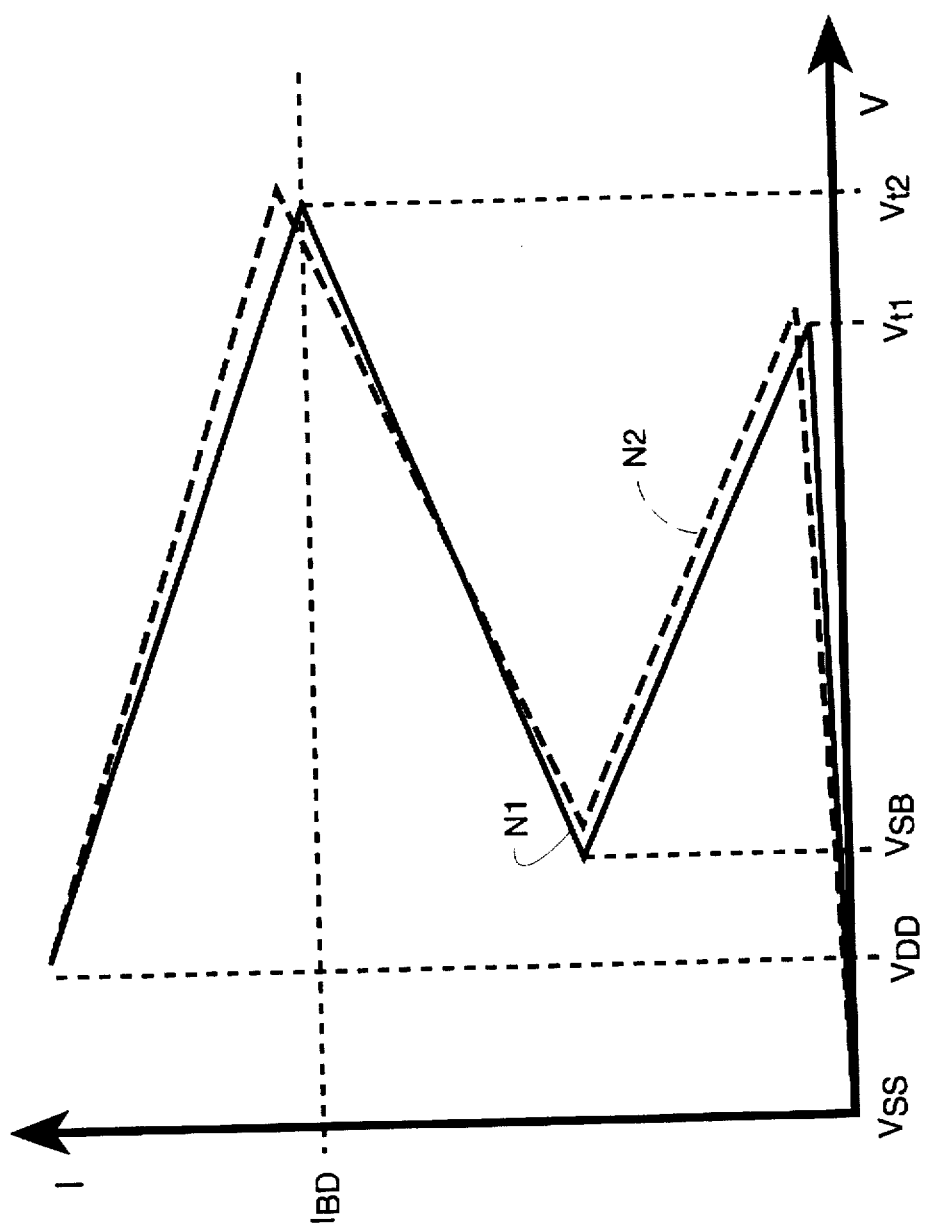
FIG. 3 is a graph of current versus voltage for the NMOS transistors of the buffer of FIG. 1.

The current-versus-voltage (I/V) characteristics of NMOS transistor N1 are represented in FIG. 3. The gate array NMOS transistors are designed to work with drain voltages between $V_{SS}$ and $V_{DD}$. Within this voltage range, there is no significant drain current. As the drain voltage approaches $V_{t1}$, during abnormal conditions, a avalanche drain current is generated. At $V_{t1}$, the voltage is great enough to generate a source-to-drain current in an NPN bipolar mode of operation. Upon initiation of the bipolar mode, the voltage falls to snap-back voltage $V_{SB}$. Further increases in voltage cause the indicated current ramp, until at $V_{t2}$, second breakdown is induced. The second breakdown results in permanent damage to the transistor. The object of ESD protection is to avoid this second breakdown.

FIG. 3 also represents the characteristics of NMOS transistor N2, which has the same nominal electrical characteristics as transistor N1. Due to processing non-uniformities, in practice small differences in electrical characteristics are expected. Since the voltage drops to snap-back voltage $V_{SB}$ when $V_{t1}$ is reached and transistor N1 goes into bipolar mode, transistor N2 does not enter bipolar mode when transistor N1 does. Thus, N2 does not share the current burden with N1. However, after N1 goes into bipolar mode and before $V_{t2}$ and the corresponding $I_{t2}$ are reached, transistor N2 goes into bipolar mode, sharing the current, countering the voltage rise to $V_{t2}$. The other NMOS transistors of input buffer 10 operate similarly. Thus, second breakdown is best averted when the lowest $V_{t2}$ is above the highest $V_{t1}$ for the transistors of an input buffer. The present invention establishes this condition through selection of a proper gate voltage coupling. For buffer 10, $V_{SS}$ is 0 V, $V_{DD}$ is 3.3 V, $V_{IN}$ varies between 0 and 3.3 volts, $V_{SB}$ is about 6 volts, $V_{t1}$ is about 10 volts, and $V_{t2}$ is about 12 volts.

Clearly, the invention can be modified to adjust $V_{t1}$ relative to $V_{t2}$ and to protect against different target ESD voltages. The invention can be scaled to different device geometries by changing metal/gate separation and overlap. As indicated, the PMOS transistor can have its gate resistively coupled to a logic high voltage; in this arrangement the PMOS transistor mirrors the NMOS transistor. Furthermore, an NMOS structure can be realized by using resistors for the pull-up devices instead of PMOS transistors. The invention also provides PMOS transistors resistively coupled to a logic high voltage, while the NMOS transistors are not; this is appropriate, for example, when the substrate is n-type and the NMOS transistors are formed in p-wells. These and other modifications to and variations upon the preferred embodiments are provided for by the present invention, the scope of which is limited only by the following claims.

What is claimed is:

1. In the fabrication of a CMOS integrated circuit in which a polysilicon layer has been deposited from which gates are to be formed, a method comprising the steps of:

patterning said polysilicon layer so as to form first and second polysilicon structures, said first polysilicon structure extending from over a channel of a PMOS channel to a high logic level contact location, said second polysilicon structure extending from over a channel of an NMOS channel to a low logic level contact location;

masking an intermediate section of said second polysilicon structure while leaving exposed a gate section of said polysilicon structure over said NMOS channel, a contact section about said logic low contact location, and at least a portion of said first polysilicon structure;

doping to render exposed polysilicon conductive;

depositing a submetal oxide;

opening contact apertures over an PMOS source, a PMOS drain, said high level contact location, an NMOS source, an NMOS drain, and said low-level contact location; and forming a metal interconnect structure for providing a logic high voltage to said first polysilicon structure at said logic high contact location, providing a logic low voltage to said logic low contact location, and an input voltage to said NMOS drain.

2. A method as recited in claim 1 wherein said mask is removed after said doping step and before said depositing step.

* * * * *

UNITED STATES PATENT AND TRADEMARK OFFICE
CERTIFICATE OF CORRECTION

PATENT NO. : 5,716,860
DATED : February 10, 1998
INVENTOR(S) : Tiao-Yuan Huang

It is certified that error appears in the above-identified patent and that said Letters Patent is hereby corrected as shown below:

Column 1, line 1, (first word of the title) change "CM OS" to --CMOS--.

Column 4, line 38, change "requiting" to --requiring--.

Column 6, line 25, change "staple" to --ample--.

Signed and Sealed this

Twenty-seventh Day of October, 1998

BRUCE LEHMAN

*Attest:*

*Attesting Officer*  *Commissioner of Patents and Trademarks*